United States Patent
Yamasaki et al.

(10) Patent No.: US 9,754,961 B2
(45) Date of Patent: Sep. 5, 2017

(54) SEMICONDUCTOR MEMORY DEVICE AND METHOD FOR MANUFACTURING SAME

(71) Applicant: Toshiba Memory Corporation, Minato-ku (JP)

(72) Inventors: Hiroyuki Yamasaki, Nagoya (JP); Makoto Fujiwara, Yokkaichi (JP); Daisuke Nishida, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/045,526

(22) Filed: Feb. 17, 2016

(65) Prior Publication Data

US 2017/0077125 A1   Mar. 16, 2017

Related U.S. Application Data

(60) Provisional application No. 62/217,494, filed on Sep. 11, 2015.

(51) Int. Cl.
| | |
|---|---|
| *H01L 27/115* | (2017.01) |
| *H01L 29/04* | (2006.01) |
| *H01L 21/02* | (2006.01) |
| *H01L 29/10* | (2006.01) |
| *H01L 27/11582* | (2017.01) |
| *H01L 27/1157* | (2017.01) |

(52) U.S. Cl.
CPC .. *H01L 27/11582* (2013.01); *H01L 21/02233* (2013.01); *H01L 27/1157* (2013.01); *H01L 29/04* (2013.01); *H01L 29/1037* (2013.01)

(58) Field of Classification Search
CPC ......... H01L 27/11578; H01L 27/11582; H01L 29/1037; H01L 29/456; G11C 16/0483
USPC .......................................................... 257/324
See application file for complete search history.

(56) References Cited

U.S. PATENT DOCUMENTS

| | | | |
|---|---|---|---|
| 8,026,546 B2 | 9/2011 | Murata et al. | |
| 8,237,218 B2 | 8/2012 | Murata et al. | |
| 8,309,405 B2 | 11/2012 | Yang et al. | |
| 8,815,676 B2 | 8/2014 | Yang et al. | |
| 8,952,443 B2 | 2/2015 | Chang et al. | |
| 9,142,563 B2 | 9/2015 | Chang et al. | |
| 2012/0068255 A1* | 3/2012 | Lee .................. | H01L 27/11582 257/324 |

(Continued)

*Primary Examiner* — Evan Pert
*Assistant Examiner* — Changhyun Yi
(74) *Attorney, Agent, or Firm* — Oblon, McClelland, Maier & Neustadt, L.L.P.

(57) ABSTRACT

According to one embodiment, a semiconductor memory device includes a substrate; a stacked body including a plurality of insulating layers and including a first insulating layer and a plurality of conductive layers including a first conductive layer; a first semiconductor film extending in a stacking direction of the stacked body; a second semiconductor film, the second semiconductor film having a maximum thickness thicker than a maximum thickness of the first semiconductor film in a first direction crossing the stacking direction; and a first insulating film. The second semiconductor film has an upper face, and a height of the upper face is lower than a height of the first conductive layer. The first insulating film has a lower end portion, and a height of the lower end portion of the first insulating film is lower than the height of the upper face of the second semiconductor film.

12 Claims, 11 Drawing Sheets

(56) References Cited

U.S. PATENT DOCUMENTS

2015/0303215 A1   10/2015  Chang et al.
2016/0240550 A1*  8/2016  Jung ................ H01L 27/11568

* cited by examiner

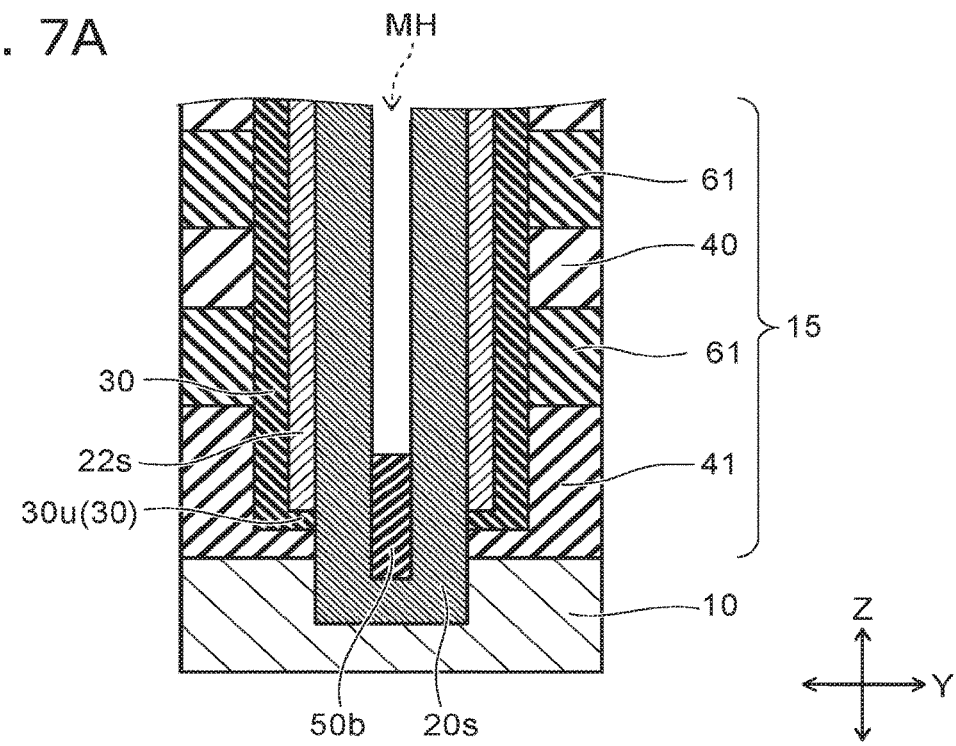
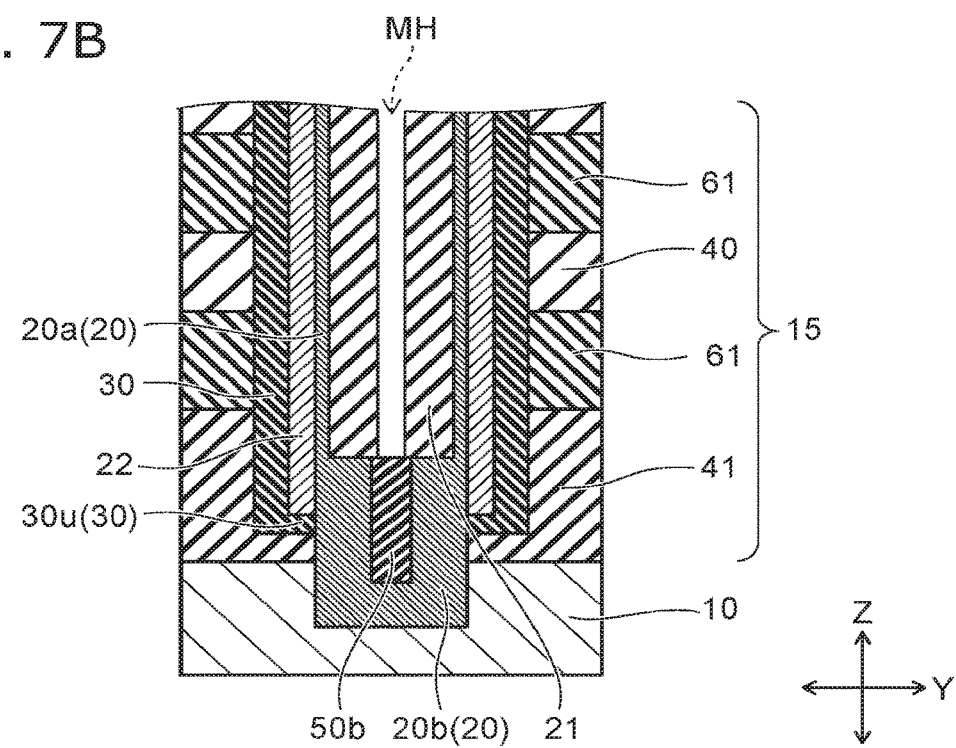

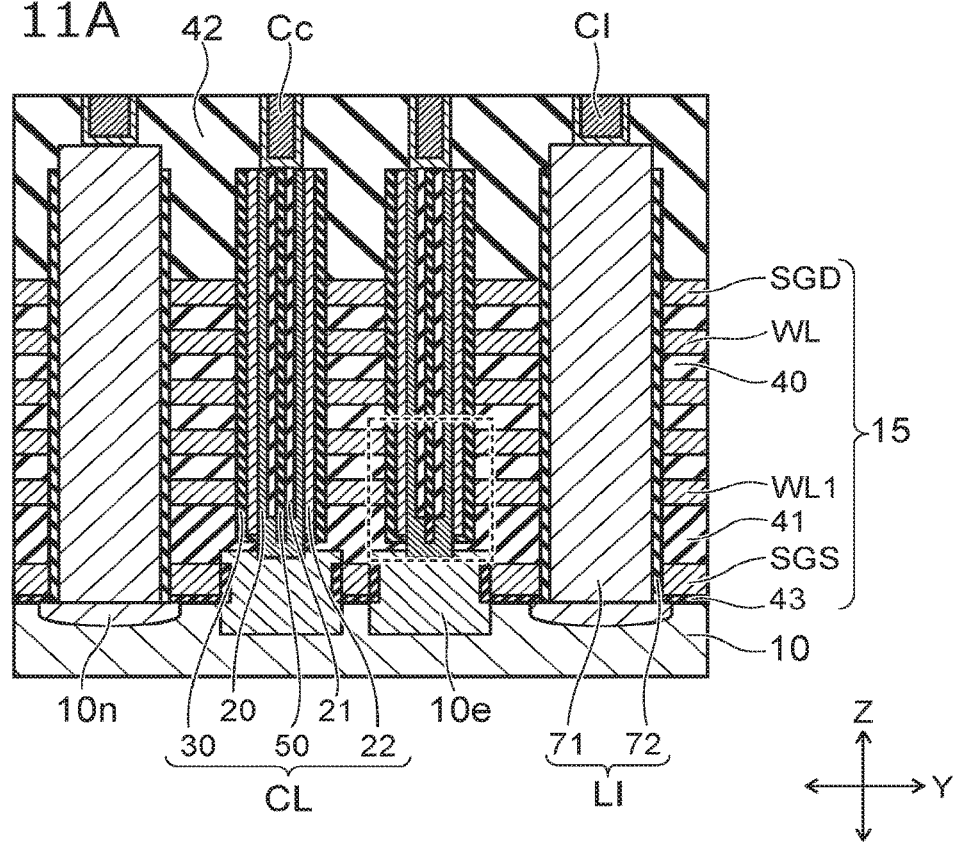
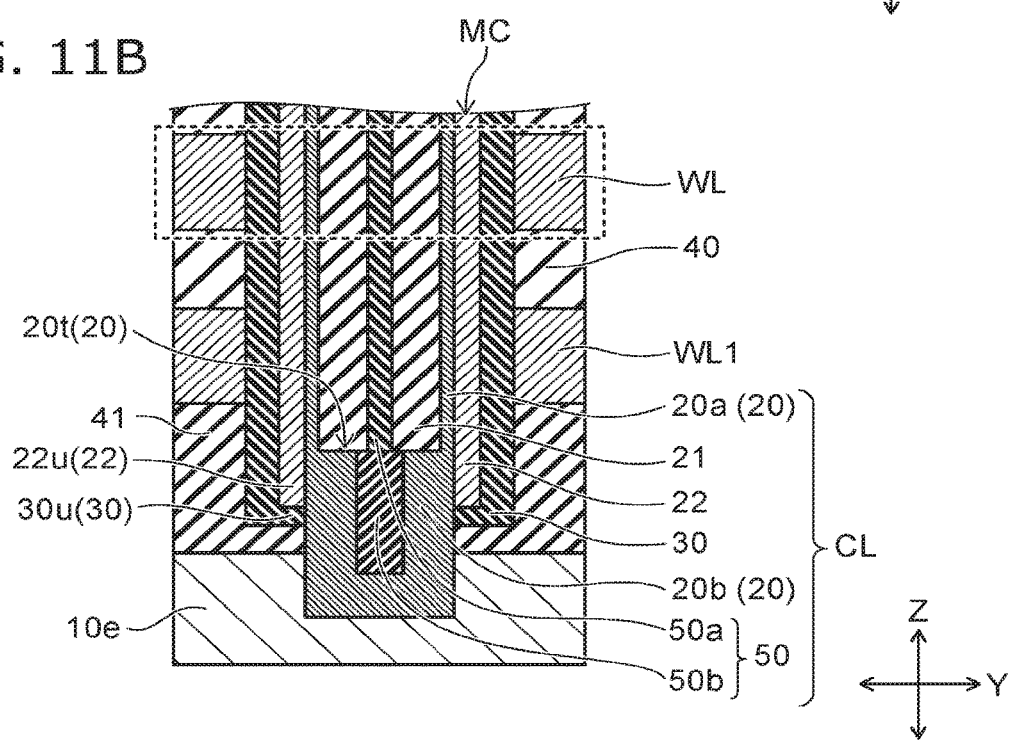

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/217,494 field on Sep. 11, 2015; the entire contents of which are incorporated herein by reference.

FIELD

Embodiments described herein relate generally to a semiconductor memory device and a method for manufacturing same.

BACKGROUND

A memory device with a three-dimensional structure has been proposed provided with a plurality of memory cells stacked with insulating layers between the memory cells.

There are concerns regarding degradation in these devices.

BRIEF DESCRIPTION OF THE DRAWINGS

FIG. 4 to FIG. 8 are schematic cross-sectional views showing a method for manufacturing the semiconductor memory device of the first embodiment;

FIG. 11A and FIG. 11B are schematic cross-sectional views of the semiconductor memory device of a third embodiment.

DETAILED DESCRIPTION

Figure 1:
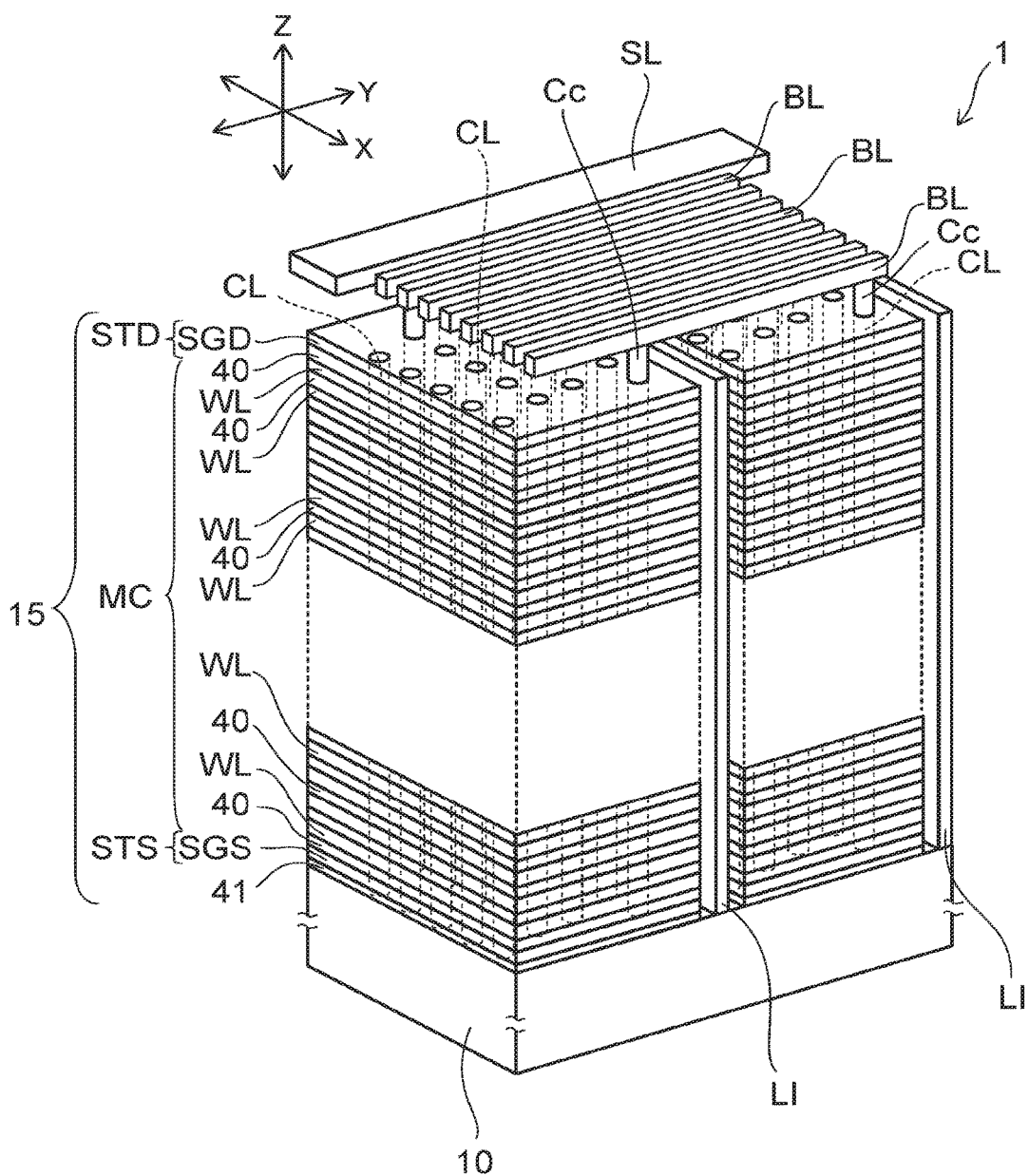
FIG. 1 is a schematic perspective view of a memory cell array of a first embodiment.

According to one embodiment, a semiconductor memory device includes a substrate; a stacked body provided on the substrate and including a plurality of insulating layers including a first insulating layer, the first insulating layer provided on the substrate and being in contact with the substrate, and a plurality of conductive layers stacked between the insulating layers and including a first conductive layer, the first conductive layer provided on the first insulating layer and being in contact with the first insulating layer; a first semiconductor film provided in the stacked body and extending in a stacking direction of the stacked body; a second semiconductor film provided integrally with the first semiconductor film, the second semiconductor film having a maximum thickness thicker than a maximum thickness of the first semiconductor film in a first direction crossing the stacking direction; and a first insulating film integrally provided between the first semiconductor film and the first conductive layer, and between the second semiconductor film and the first insulating layer, the first insulating film extending in the stacking direction and being in contact with the second semiconductor film. The second semiconductor film has an upper face, and a height of the upper face is lower than a height of the first conductive layer. The first insulating film has a lower end portion, and a height of the lower end portion of the first insulating film is lower than the height of the upper face of the second semiconductor film.

Hereinafter, embodiments will be described with reference to the drawings. In the drawings, the same elements are denoted by the same reference sign.

First Embodiment

An example of the configuration of a memory cell array 1 according to the embodiment will be explained with reference to FIG. 1 and FIG. 2.

FIG. 1 is a schematic perspective view of the memory cell array 1 of the embodiment. In FIG. 1, insulating layers or the like on a stacked body are omitted for ease of understanding.

In FIG. 1, two mutually perpendicular directions parallel to a major surface of a substrate 10 are defined as the X-direction (second direction) and the Y-direction (first direction), and the direction perpendicular to both the X-direction and the Y-direction is defined as the Z-direction (stacking direction).

Figure 2:
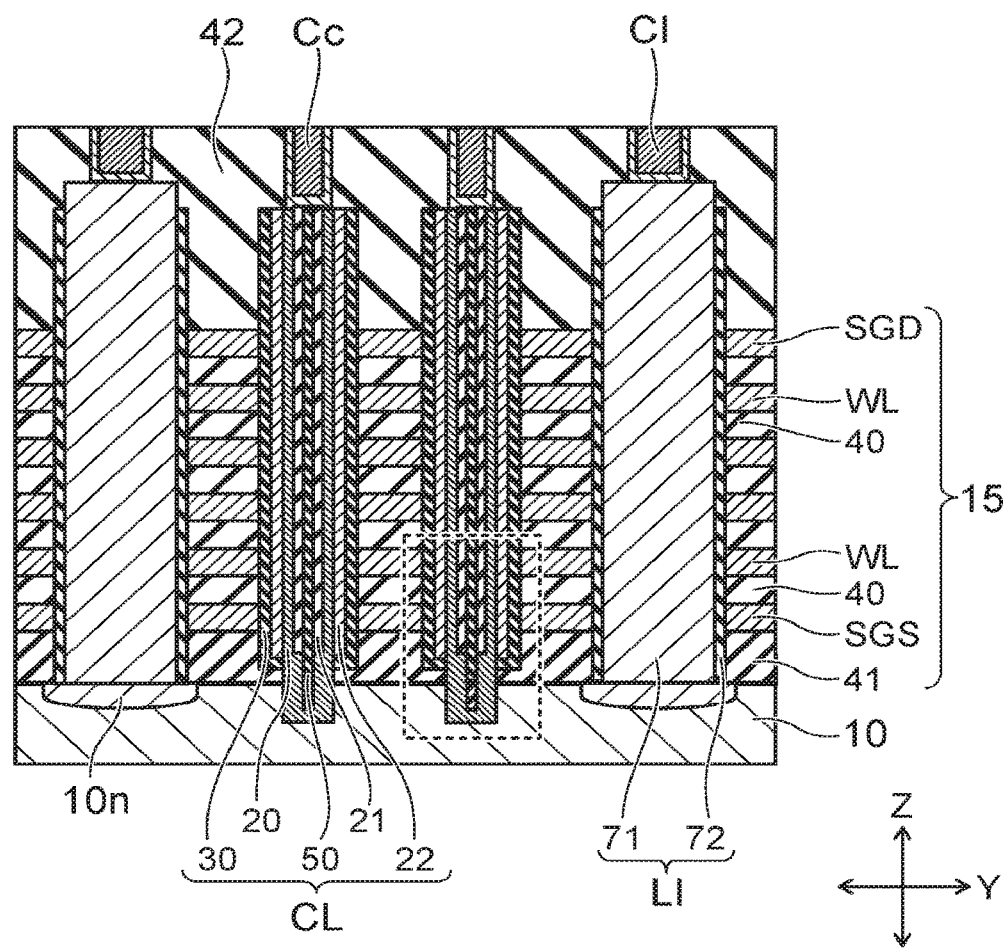
FIG. 2 is a schematic cross-sectional view of the semiconductor memory device of the first embodiment.

FIG. 2 is a schematic cross-sectional view of the semiconductor memory device according to the embodiment. In FIG. 2, illustration of upper layer interconnection or the like is omitted for ease of understanding.

As illustrated in FIG. 1 and FIG. 2, the memory cell array 1 includes a stacked body 15, a plurality of columns CL, an interconnection layer LI, and an upper layer interconnection. In FIG. 1, bit lines BL and a source layer SL are illustrated as the upper layer interconnection.

The stacked body 15 is provided on the substrate 10. The stacked body 15 includes a plurality of conductive layers, and a plurality of insulating layers 40, 41. The plurality of conductive layers includes a source-side select gate SGS (first conductive layer), a drain-side select gate SGD, and a plurality of electrode layers WL.

The plurality of electrode layers WL is stacked with the plurality of insulating layers 40, 41 provided between the electrode layers WL. The plurality of insulating layers 40, 41 includes, for example, an air gap. The number of layers of the electrode layer WL illustrated on the drawings is an example, and the number of layers of the electrode layers WL is optional.

The source-side select gate SGS is provided on the lowermost layer of the stacked body 15. The drain-side select gate SGD is provided on the uppermost layer of the stacked body 15. The insulating layer 41 (first insulating layer) is provided between the source-side select gate SGS and the substrate 10. The insulating layer 41 is in contact with the substrate 10 and the source-side select gate SGS.

The electrode layer WL includes a metal. The electrode layer WL includes at least any of, for example, tungsten, molybdenum, titanium nitride, and tungsten nitride, and may include silicon or a metal silicide. The source-side select gate SGS and the drain-side select gate SGD include the same material as the electrode layers WL.

The thickness of one layer of the drain-side select gate SGD and the source-side select gate SGS is normally thicker than the thickness of one layer of the electrode layers WL, but it may be the equal thickness or thinner. Note that the select gates (SGD, SGS) need not be a single layer, but a plurality of layers may be provided. Note that, here "thickness" refers to the thickness in the stacking direction (Z-direction) of the stacked body 15.

The plurality of columns CL extending in the Z-direction is provided in the stacked body 15. The column CL is provided as a cylindrical pillar or an elliptical pillar shape, for example. The plurality of columns CL is provided in a staggered lattice arrangement, for example. Alternatively, the plurality of columns CL may be provided in a square lattice arrangement along the X-direction and the Y-direction. The column CL is electrically connected to the substrate 10.

The column CL includes a channel body 20 (first, second semiconductor film), an insulating film 21 (second insulating film), a cover film 22 (third semiconductor film), a memory film 30 (first insulating film), and a core insulating film 50 (third insulating film). The memory film 30 is provided between the electrode layer WL and the channel body 20, and the cover film 22 is provided between the channel body 20 and the memory film 30. The memory film 30 encloses the cover film 22, the channel body 20, the insulating film 21, and the core insulating film 50. The memory film 30, the cover film 22, the channel body 20, the insulating film 21, and the core insulating film 50 extend in the Z-direction.

The insulating film 21 is provided on the inner side of the channel body 20. The core insulating film 50 is provided on the inner side of the insulating film 21.

The channel body 20 and the cover film 22 are, for example, a silicon film that contains silicon as the major component, and includes, for example, polysilicon. The insulating film 21 includes a silicon oxide film, for example. The core insulating film 50 includes a silicon oxide film, for example, and may include an air gap. The insulating film 21 is provided, for example, as a separate body to the core insulating film 50, having an interface at the portion in contact with the core insulating film 50.

The interconnection layer LI extending in the X-direction and the Z-direction is provided in the stacked body 15, and separated from a contiguous stacked body 15. In addition, a plurality of interconnection layers LI likewise extending in the Y-direction that is not illustrated on the drawings is provided around the memory cell array 1. Also, the interconnection layer LI has a structure provided in a matrix form, when viewed from above the memory cell array 1. Therefore, the stacked body 15 has a structure that is divided in matrix form by the interconnection layer LI. The interconnection layer LI includes a conductive film 71 and an insulating film 72. The insulating film 72 is provided on a side wall of the interconnection layer LI. The conductive film 71 is provided on the inner side of the insulating film 72.

The lower end of the interconnection layer LI is in contact with a semiconductor portion 10n of the substrate 10. The interconnection layer LI is electrically connected to the channel body 20 within the column CL via the substrate 10. The upper end of the interconnection layer LI is electrically connected to the source layer SL via a contact portion CI.

The plurality of bit lines (for example, metal films) BL is provided on the stacked body 15. Each of the bit lines BL is separated from each other in the X-direction, and extends in the Y-direction. Each of the bit lines BL is connected to one of the channel bodies 20 selected from each region separated in the Y-direction by the interconnection layer LI.

The upper end of the channel body 20 is electrically connected to the bit line BL via a contact portion Cc. The lower end of the channel body 20 is in contact with the substrate 10.

A drain-side select transistor STD is provided on the upper end of the column CL, and a source-side select transistor STS is provided on the lower end of the column CL.

A memory cell MC, the drain-side select transistor STD, and the source-side select transistor STS are vertical transistors in which the electric current can flow in the stacking direction (Z-direction) of the stacked body 15.

Each select gate SGD, SGS functions as a gate electrode (a control gate) of the select transistors STD, STS. An insulating film that functions as a gate insulating film for the select transistors STD, STS is provided between each of the select gates SGD, SGS and the channel body 20.

A plurality of memory cells MC in which the electrode layer WL of each layer functions as the control gate is provided between the drain-side select transistor STD and the source-side select transistor STS.

Such a plurality of memory cells MC, drain-side select transistor STD, and source-side select transistor STS is connected in series via the channel body 20, and configure a single memory string. The memory string is provided in a staggered lattice arrangement, for example, in a surface direction parallel to the X-Y plane, and the plurality of memory cells MC is provided in a three-dimensional manner in the X-direction, the Y-direction, and the Z-direction.

The semiconductor memory device according to the embodiment can electrically erase and write data freely and store memory contents even after a power source is turned off.

Next, an example of the configuration of a memory cell MC according to the embodiment will be explained with reference to FIG. 3A.

Figure 3A:
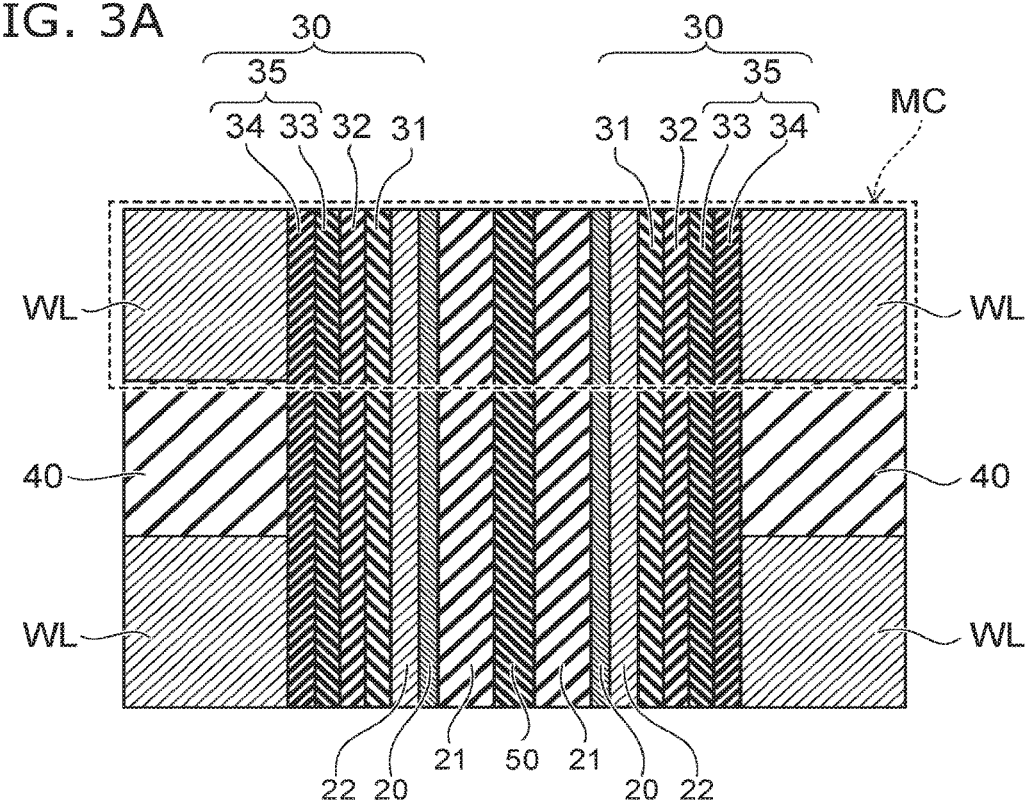
FIG. 3A is an enlarged schematic cross-sectional view of a portion of a column portion of the first embodiment and FIG. 3B is a schematic cross-sectional view of the semiconductor memory device of the first embodiment.

FIG. 3A is an enlarged cross-sectional view schematically illustrating a portion of the column CL of the embodiment.

The memory cell MC is, for example, a charge trap type, and includes the electrode layer WL, the memory film 30, the cover film 22, the channel body 20 (first semiconductor film), the insulating film 21, and the core insulating film 50.

The memory film 30 has a charge storage film 32, a tunnel insulating film 31, and a block insulating film 35. The tunnel insulating film 31 is provided in contact with the cover film 22. The charge storage film 32 is provided between the block insulating film 35 and the tunnel insulating film 31.

The channel body 20 functions as a channel in the memory cell MC, and the electrode layer WL functions as a control gate of the memory cell MC. The charge storage film 32 functions as a data memory layer that stores electric charges injected from the channel body 20. The block insulating film 35 prevents diffusion of the electric charges accumulated in the charge storage film 32 to the electrode layer WL. In other words, the memory cell MC is formed having a structure in which a control gate encompasses the channel periphery at the location where the channel body 20 and each of the electrode layers WL intersect.

The block insulating film 35 includes, for example, a cap film 34 and a block film 33. The block film 33 is provided between the cap film 34 and the charge storage film 32. The block film 33 is a silicon oxide film, for example.

The cap film 34 is provided in contact with the electrode layer WL. The cap film 34 is a film having a dielectric constant higher than that of the block film 33.

By disposing the cap film 34 in contact with the electrode layer WL, it is possible to suppress back tunneling electrons that are injected from the electrode layer WL at the time of erasing, and improve the charge blocking properties.

The charge storage film 32 has a large number of trap sites that trap the charge. The insulating film 32 includes, for example, at least one of a silicon nitride film and hafnium oxide.

The tunnel insulating film 31 functions as a potential barrier when electric charges are injected from the channel body 20 into the charge storage film 32, or when the electric charges stored in the charge storage film 32 diffuses to the channel body 20. The tunnel insulating film 31 includes a silicon oxide film, for example.

Alternatively, a stacked film that is a SiO2-Si3N4-SiO2 (ONO) film and that has a configuration in which a silicon nitride film is interposed between a pair of silicon oxide films may also be used as the tunnel insulating film 31. If the ONO film is used as the tunnel insulating film 31, an erase operation can be performed with a lower electric field compared with a single layer of a silicon oxide film.

Next, an example of the configuration of the semiconductor memory device of the embodiment will be described with reference to FIG. 3B.

Figure 3B:
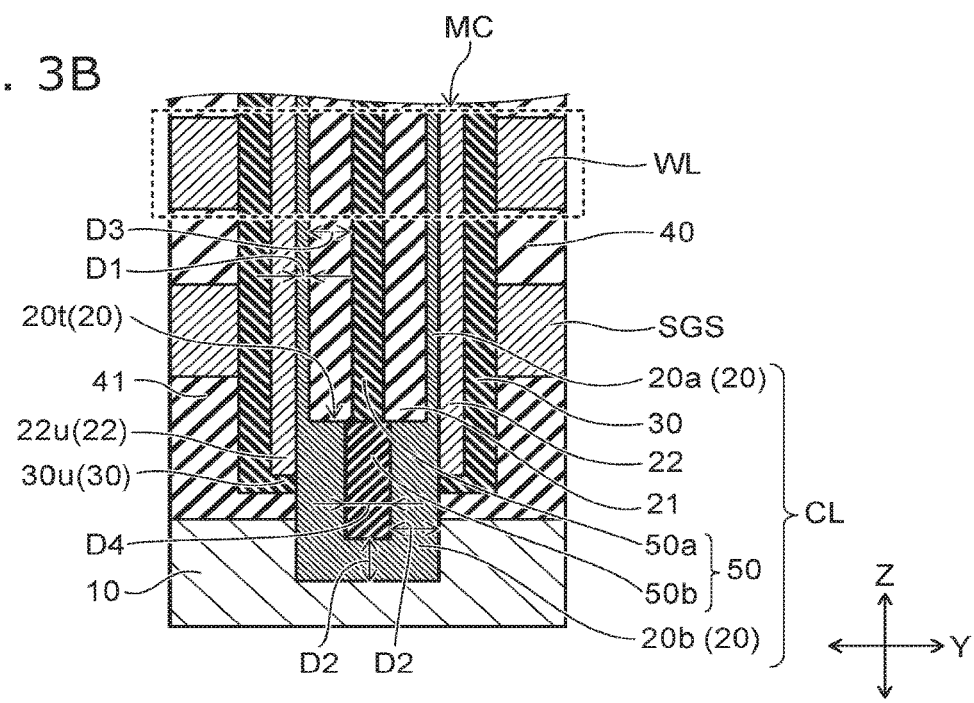

FIG. 3B is a schematic cross-sectional view of the dotted line portion illustrated in FIG. 2.

As illustrated in FIG. 3, the channel body 20 includes a first channel body 20a and a second channel body 20b. The first channel body 20a is provided integrally with the second channel body 20b. The second channel body 20b is provided between the first channel body 20a and the substrate 10.

The lower face of the second channel body 20b is provided in the substrate 10, and the lower face of the second channel body 20b and a portion of the lower side surface of the second channel body 20b contact the substrate 10. The upper face 20t of the second channel body 20b has a portion in contact with the insulating film 21. In other words, the thickness of the channel body 20 is different above and below the upper face 20t. In other words, in the Y-direction, the maximum thickness D2 of the second channel body 20b is thicker than the maximum thickness D1 of the first channel body 20a. Note that here the "the maximum thickness D2 of the second channel body 20b" refers of the distance between the side surface or lower surface of the second channel body 20b and the core insulating film 50.

The height of the upper face 20t is lower than the height of the source-side select gate SGS. The insulating layer 41 is provided between the source-side select gate SGS and the substrate 10, with no conductive layer between the source-side select gate SGS and the substrate 10. Therefore, the second channel body 20b is surrounded by the insulating layer 41, but not a conductive layer. The first channel body 20a is surrounded by the electrode layers WL, the source-side select gate SGS, and the insulating layers 40, 41. Note that here the "height" refers to the height in the Z-direction with reference to the surface of the substrate 10 that is in contact with the insulating layer 41, and refers to the position being higher from the substrate 10 toward the stacked body 15.

The memory film 30 is integrally provided between the first channel body 20a and the source-side select gate SGS, between the first channel body 20a and the insulating layer 41, and between the second channel body 20b and the insulating layer 41. The memory film 30 is surrounded by the electrode layers WL, the source-side select gate SGS, and the insulating layers 40, 41.

A lower end portion 30u of the memory film 30 is in contact with a side surface of the second channel body 20b. The height of the lower end portion 30u is lower than the height of the source-side select gate SGS, and lower than the height of the upper face 20t of the second channel body 20b.

The cover film 22 is integrally provided between the memory film 30 and the first channel body 20a, and between the memory film 30 and the second channel body 20b. The cover film 22 is in contact with the first channel body 20a and the second channel body 20b. The height of a lower end portion 22u of the cover film 22 is higher than the height of the lower end portion 30u of the memory film 30, and lower than the height of the upper face 20t of the second channel body 20b. The lower end portion 22u of the cover film 22 is in contact with the lower end portion 30u of the memory film 30. The lower end portion 30u of the memory film 30 is provided between the cover film 22 and the substrate 10.

The insulating film 21 is provided on the inner side of the first channel body 20a. The insulating film 21 is in contact with the upper face 20t of the second channel body 20b, and separated from the inner side of the second channel body 20b. In the Y-direction, the maximum thickness D2 is thicker than the maximum thickness D3 of the insulating film 21.

The core insulating film 50 is provided on the inner side of the insulating film 21 and on the inner side of the second channel body 20b. The core insulating film 50 includes a first core insulating portion 50a (first insulating portion), and a second core insulating portion 50b (second insulating portion). The first core insulating portion 50a is provided in a position higher than the height of the upper face 20t of the second channel body 20b, and in contact with a side surface of the inner side of the insulating film 21. The second core insulating portion 50b is provided below the first core insulating portion 50a, and in contact with a side surface of the inner side of the second channel body 20b. The core insulating film 50 is separated from the first channel body 20a.

In the Y-direction, the maximum thickness D2 is, for example, thicker than the maximum thickness D4 of the core insulating film 50.

The size of crystallites of the first channel body 20a is equal to the size of crystallites of the second channel body 20b. As described in the method of manufacturing later, for example amorphous silicon that is heat-treated (crystallization annealing) to form polysilicon can be used as the channel body. At this time, crystallites are formed whose size depends on the film thickness of the amorphous silicon. In other words, when the film thickness of the amorphous silicon is thick, the size of the crystallites is formed larger.

In contrast, according to the embodiment, the maximum thickness D1 of the first channel body 20a is thinner than the maximum thickness D2 of the second channel body 20b, and, the size of the crystallites of the first channel body 20a is equal to the size of the crystallites of the second channel body 20b.

The reason is in accordance with the method of manufacturing of the embodiment, after forming large size crystallites in the channel body 20 by crystallization annealing, an oxidation process is carried out on a portion of the inner side of the channel body 20 to form the insulating film 21. In this way, the first channel body 20a having large size crystallites and a thin film can be formed on the outer side of the insulating film 21.

Note that, although not illustrated on FIG. 3B, for example, the lower end portion 30u may contacts the substrate 10.

Note that the unit of the size of the crystallites is given in, for example, nm. Also the size of the crystallites can be measured using, for example, x-ray diffraction, electron backscatter diffraction (EBSD) patterns, a transmission electron microscope (TEM), a scanning electron microscope (SEM), or the like.

Next, an example of a method for manufacturing the semiconductor memory device of the embodiment will be described with reference to FIG. 4 to FIG. 8.

First, after forming a device isolation region on the substrate 10, a peripheral transistor is formed (not illustrated on the drawings).

Figure 4:
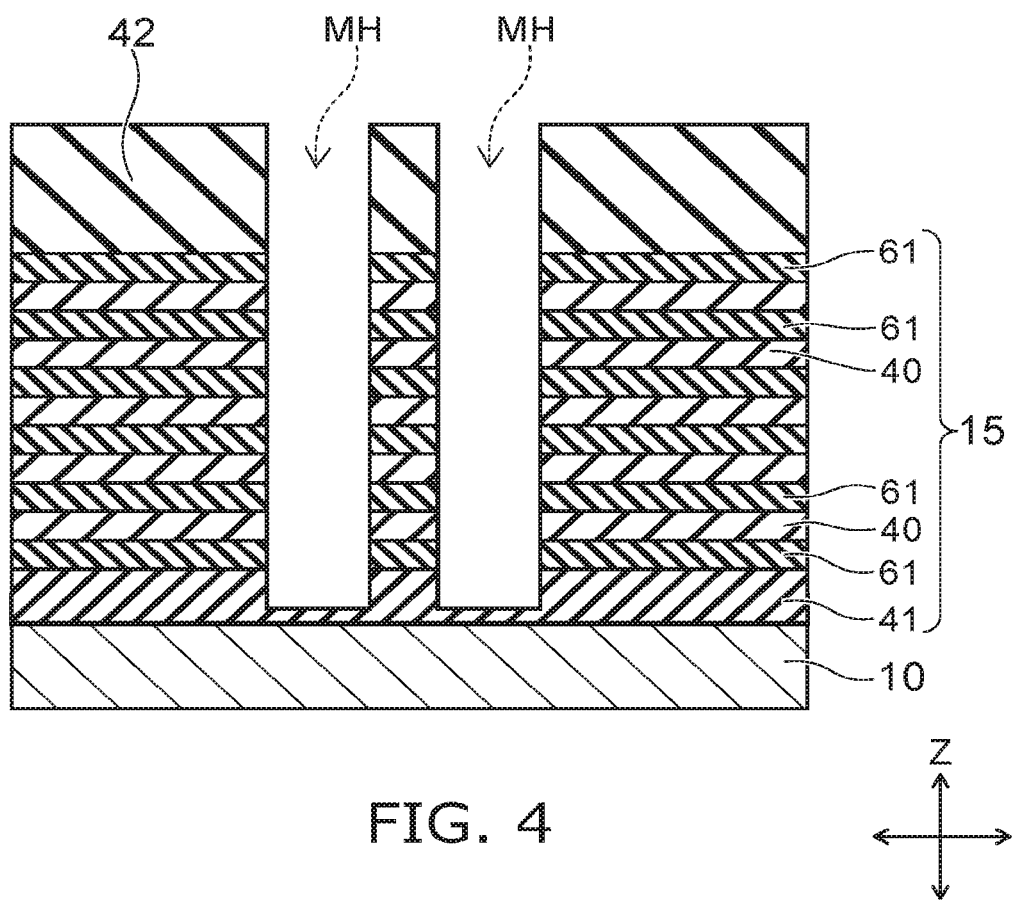

Next, as illustrated in FIG. 4, the insulating layer 41 (first insulating layer) is formed. A sacrificial layer 61 (second layer) is formed on the insulating layer 41. A plurality of the insulating layers 40 and a plurality of the sacrificial layers 61 (plurality of first layers) are stacked alternately on the sacrificial layer 61. Thereby, the stacked body 15 is formed. The sacrificial layer 61 is, for example, a silicon nitride film. The insulating layer 40 is a silicon oxide film, for example. An insulating layer 42 is formed on the stacked body 15.

Then, a hole MH is formed passing through the insulating layer 42 and the stacked body 15, reaching the insulating layer 41. The hole MH is formed by the reactive ion etching (RIE) method using a mask that is not illustrated in the drawings, for example.

Figure 5A:
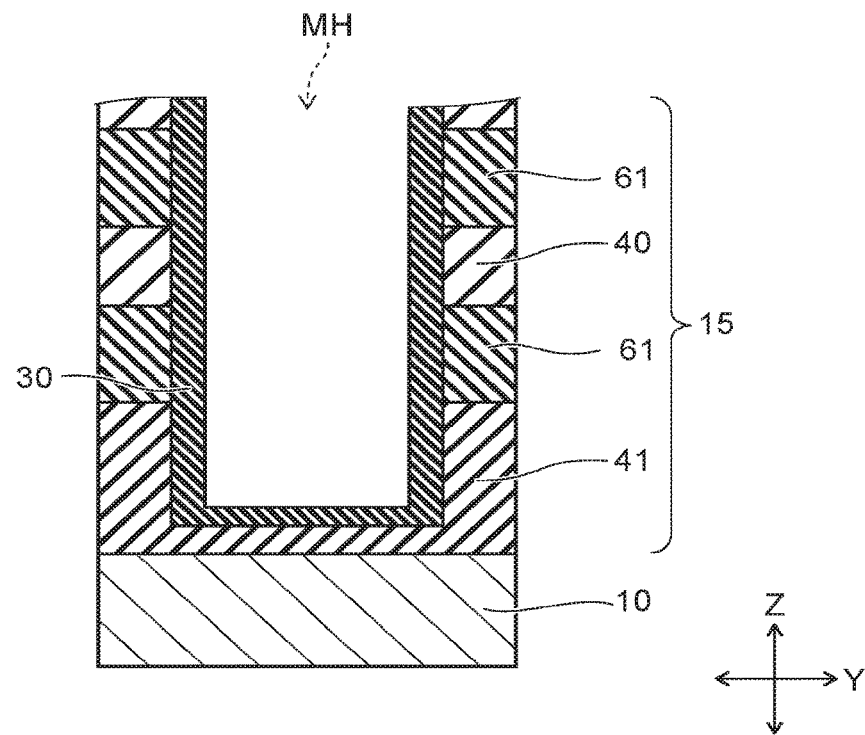

As illustrated in FIG. 5A, the memory film 30 having the charge storage film 32 is formed in the hole MH. In this way, the memory film 30 is integrally formed on the wall face (side wall, lower face) of the hole MH.

Figure 5B:
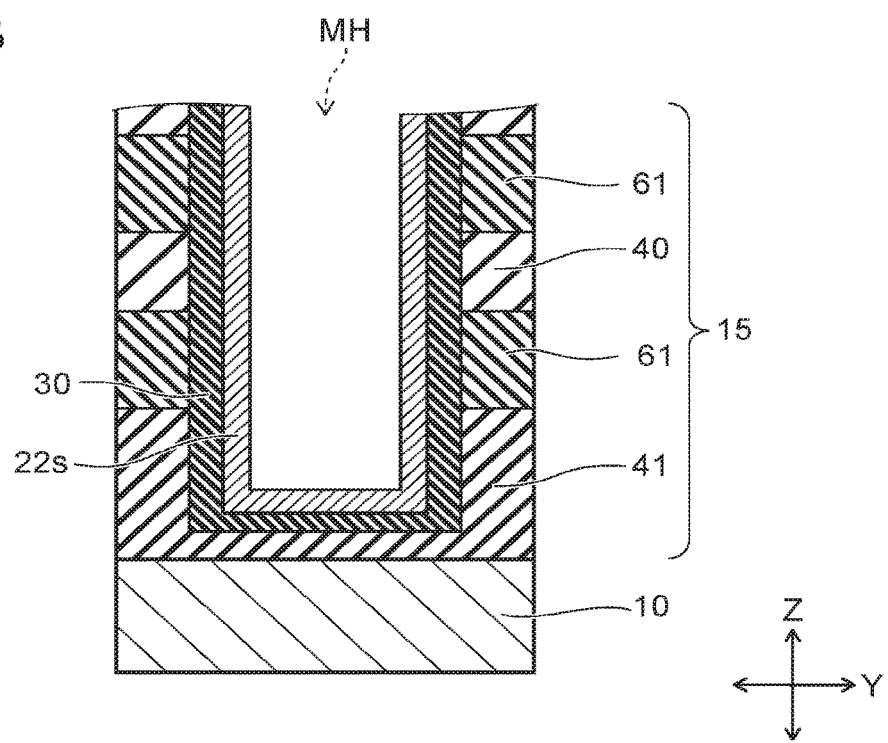

As illustrated in FIG. 5B, a cover film 22s is formed on the inner side of the memory film 30. The cover film 22s includes, for example, amorphous silicon.

Figure 6A:
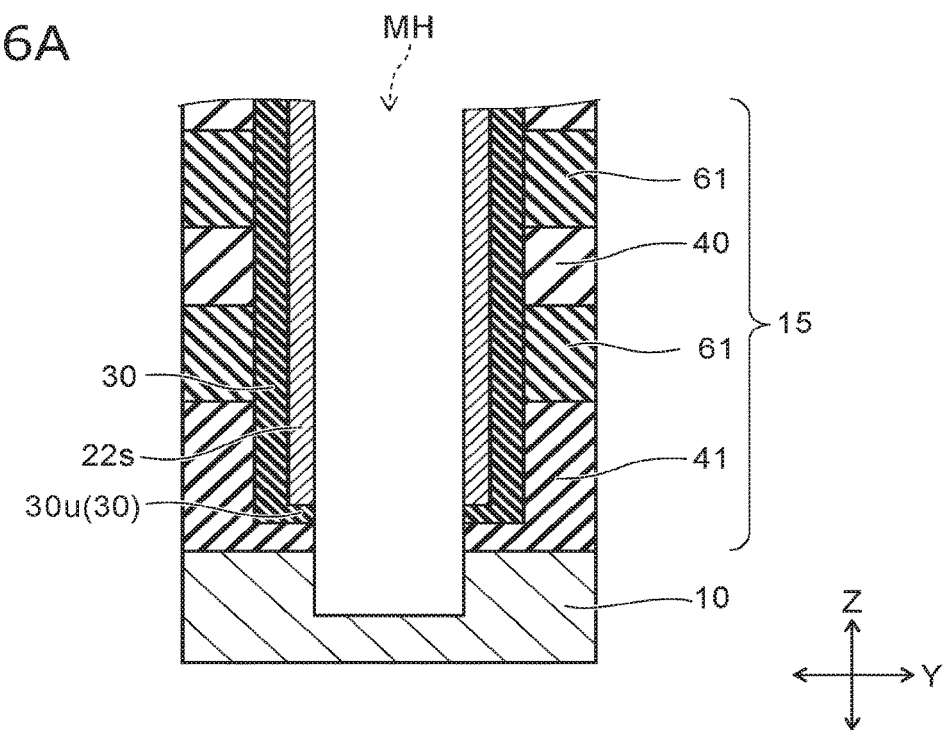

As illustrated in FIG. 6A, the hole MH is formed passing through the memory film 30, the cover film 22s, and the insulating layer 41 formed on the lower face of the hole MH, and reaches the substrate 10. As a result, the substrate 10 is exposed at the lower face of the memory hole MH.

Figure 6B:
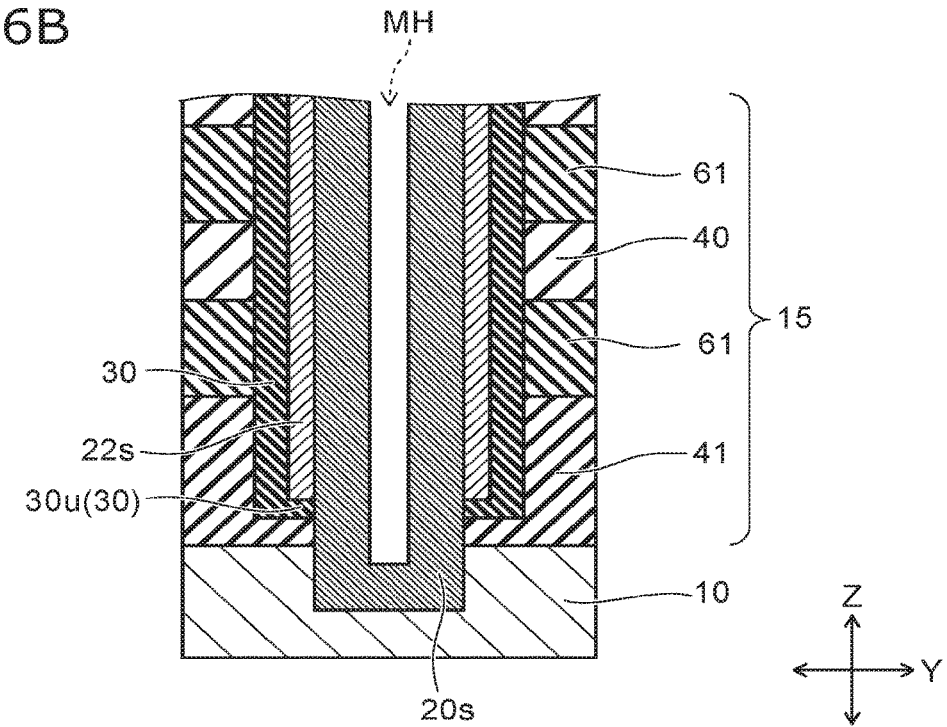

As illustrated in FIG. 6B, a channel body 20s is formed on the inner side of the cover film 22s and on the side wall of the hole. The channel body 20s is, for example, formed thicker than the cover film 22s. The channel body 20s includes, for example, amorphous silicon. The lower face of the channel body 20s is in contact with the substrate 10.

As illustrated in FIG. 7A, the second core insulation portion 50b is formed on the inner side of the channel body 20s. For example, the second core insulating portion 50b is deposited on the inner side of the channel body 20s, and is reduced to a height that is lower than the lower face of the sacrificial layer 61. In this way, the upper face of the second core insulating portion 50b is formed with a height between that of the lower end portion 30u of the memory film 30 and the sacrificial film 61 in contact with the insulating layer 41. In other words, the second core insulating portion 50b is surrounded by the insulating layer 41, and is not surrounded by the sacrificial layer 61.

As illustrated in FIG. 7B, the channel body 20s and the cover film 22s are heat-treated. In this way, the channel body 20 and the cover film 22 are formed, and the insulating film 21 is formed on the inner side of the channel body 20 (surface exposed by the hole MH). For example, the thermal annealing is carried out in an oxygen atmosphere.

By heat treating the amorphous silicon of the channel body 20s and the cover film 22s, polysilicon having crystallites is formed (crystallization annealing). In this way, the channel body 20 and the cover film 22 are formed including polysilicon. At this time, by forming the film thickness of the combined channel body 20s and the cover film 22s comparatively thick, crystallites (grains) with a comparatively large size can be obtained when crystallizing by thermal annealing. For example, the crystallites are substantially formed from a side surface in contact with the oxide film (second core insulating portion 50b, memory film 30), and their size is from several tens of nm to about 200 nm, between three and ten times the combined film thickness of the channel body 20 and the cover film 22s.

On the other hand, for example solid phase growth seeded by silicon supplied from the substrate 10 proceeds into the channel body 20 due to the thermal annealing, and in some cases crystallites are formed. At this time, the size of the crystallites is from several hundreds of nm to about several μm.

Also, the inner side of the channel body 20 is oxidized by the thermal annealing. In this way, the insulating film 21 is formed. In the oxidation process, the insulating film 21 is masked by the second core insulating portion 50b, so the insulating film 21 is formed on the upper side from the portion masked by the second core insulating portion 50b. In this way, the channel body 20 includes the first channel body 20a and the second channel body 20b, each with a different thickness, and the insulating film 21 is formed on the inner side of the first channel body 20a. Also, the size of the crystallites of the first channel body 20a is, for example, equal to the size of the crystallites of the second channel body 20b.

As illustrated in FIG. 3B, in the Y-direction, the maximum thickness D2 of the second channel body 20b is thicker than the maximum thickness D1 of the first channel body 20a. For example, the ratio of the size of the crystallites of the first channel body 20a to the maximum thickness D1 is not less than the ratio of the size of the crystallites of the second channel body 20b to the maximum thickness D2.

In other words, by forming the crystallites and forming the insulating film 21 by thermal annealing, the first channel body 20a and the second channel body 20b are formed with large-size crystallites, and each having different thicknesses.

Note that for example the thermal annealing (crystallization annealing) may be carried out to form the channel body 20 having the crystallites, before forming the second insulating portion 50b. In this case, after forming the channel body 20, the second core insulating portion 50b is formed, and then, the insulating film 21 is formed by thermal annealing of the channel body 20.

Figure 8:
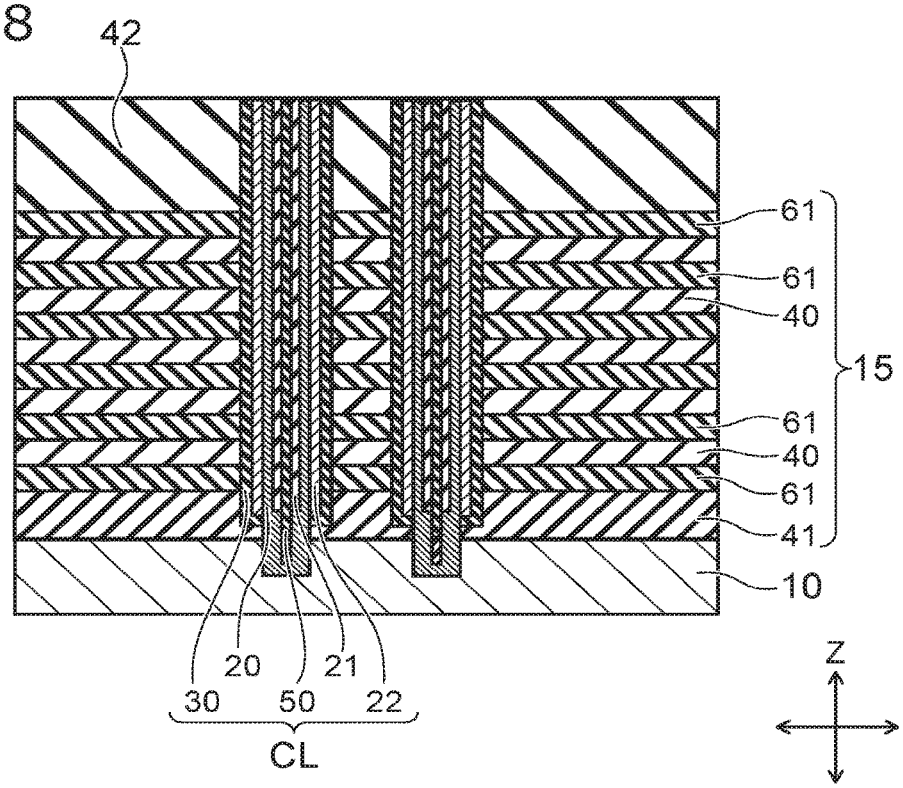

As illustrated in FIG. 8, the second core insulating portion 50b illustrated in FIG. 3B is formed on the inner side of the insulating film 21, to form the core insulating film 50. The second core insulating portion 50b may have the same material as the first core insulating portion 50a, or may have a different material. Accordingly, the columns CL are formed.

Then, a slit is formed in the stacked body 15, and the plurality of sacrificial layers 61 is removed using the slit. In the portion where the plurality of sacrificial layers 61 has been removed, the plurality of conductive layers (electrode layers WL, source-side select gate SGS, and drain-side select gate SGD) illustrated in FIGS. 1 and 2 are formed.

Next, the insulating film 72 and the conductive film 71 are formed in the slit, to form the interconnection layer LI. The contact portions CI, Cc are formed on the interconnection layer LI and the columns CL. Then, the upper layer interconnection and the like are formed, and the semiconductor memory device of the embodiment is formed.

Note that instead of forming the sacrificial layers 61, a method in which the electrode layers WL and the source-side select gate SGS are formed from the beginning may be used.

The effects of the embodiment will be described.

According to the embodiment, the degradation of the memory characteristics can be suppressed while improving the cell current.

For example, in order to improve the cell current, the method of forming the thickness of the channel body thinner, and generating carriers by the fringe electric field between electrode layers can be considered. In this way, the quantity trapped can be reduced, and the generation of carriers promoted, to improve the cell current of the three-dimensional memory.

However, when forming a channel body with a thickness thin enough to produce the improvement in cell current as described above, the thickness around the lower face of the channel body is formed thinner than the thickness of the channel body 20 formed on the upper layer side of the stacked body, and there is a possibility of an open defect occurring.

In contrast, according to the embodiment, the maximum thickness D2 of the second channel body 20b is thicker than the maximum thickness D1 of the first channel body 20a. Therefore, it is possible to suppress open defects (degradation of memory characteristics) while improving the cell current.

Also, the method of forming crystallites of large size within the channel body can be considered as a different method for improving the cell current of the three-dimensional memory. In this way, the mobility of the channel body is improved (trap level reduced), the resistance of the channel body is reduced, and the cell current of the three-dimensional memory is increased.

However, in order to form crystallites with large size, for example when forming the channel body with a thick film thickness, generation of carriers by the fringe electric field between the electrode layers as described above is hindered, and as a result there is a possibility that no improvement in the cell current can be obtained.

In contrast, according to the embodiment, the insulating film 21 is provided by oxidizing a portion of the channel body 20. In this way, the size of the crystallites of the first channel body 20a is equal to the size of the crystallites of the second channel body 20b, and, the thickness of the first channel body 20a is thinner than the thickness of the second channel body 20b. For example, the ratio of the size of the crystallites of the first channel body 20a to the maximum thickness D1 is not less than the ratio of the size of the crystallites of the second channel body 20b to the maximum thickness D2. In other words, it is possible to simultaneously satisfy the conditions for reducing the thickness of the channel body 20 and increasing the size of the crystallites, so degradation of the memory characteristics can be suppressed while improving the cell current.

Also, according to the embodiment, the height of the upper face 20t of the second channel body 20b is higher than the height of the lower end portion 30u of the memory film 30, and lower than the height of the source-side select gate SGS. As a result, the degradation in the characteristics can be further suppressed.

For example, there is a case in which the height of the upper face of the second channel body is lower than the height of the lower end portion of the memory film. In this case, the first channel body with a thin film thickness is provided around the portion in contact with the substrate. Therefore, the load on the first channel body is increased, and the potential for causing an open defect is increased. Also, there is a case in which the height of the upper face of the second channel body is higher than the source-side select gate. In this case, the second channel body with a thick film thickness is provided around the portion surrounded by the conductive layer. Therefore, the quantity trapped between conductive layers is increased, and there is a possibility that the generation of carriers may be hindered.

In contrast, according to the embodiment, the first channel body 20a is separated from the vicinity of the portion in contact with the substrate 10, and the second channel body 20b is separated from the vicinity of the portion surrounded by the conductive layer. Therefore, it is possible to suppress degradation of the memory characteristics while improving the cell current.

Second Embodiment

Next, an example of the configuration of the semiconductor memory device of the embodiment will be described with reference to FIG. 9.

In the embodiment, the main difference from the embodiment described above is the configuration of the insulating film. Therefore, the descriptions of the parts that are the same as the embodiment described above are partially omitted.

Figure 9:
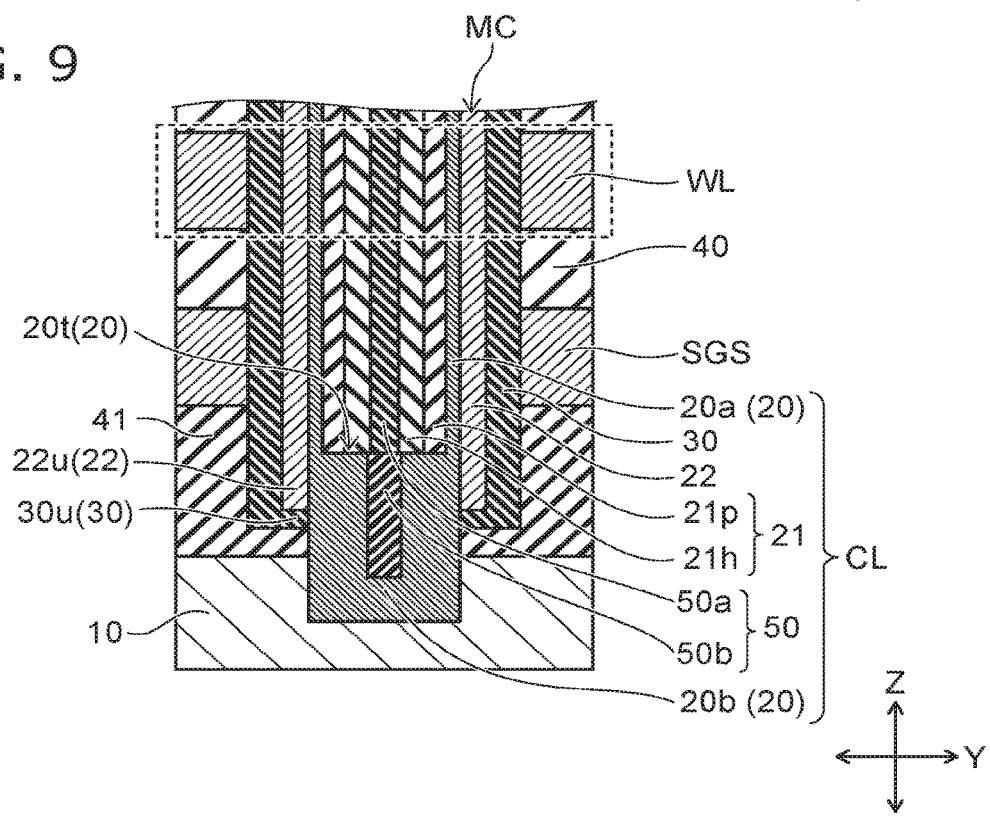
FIG. 9 is a schematic cross-sectional view of the semiconductor memory device of a second embodiment.

As illustrated in FIG. 9, the insulating film 21 includes a third insulating portion 21p and a fourth insulating portion 21h. The third insulating portion 21p is provided on the inner side of the first channel body 20a, and in contact with the upper face 20t of the second channel body 20b. The fourth insulating portion 21 h is provided on the inner side of the third insulating portion 21p, and in contact with the upper face 20t of the second channel body 20b. The first core insulating portion 50a is provided on the inner side of the fourth insulating portion 21h.

The third insulating portion 21p and the fourth insulating portion 21 h include, for example, an oxide film by oxidation of the channel body 20, and are for example silicon oxide films. For example, the film density of the silicon oxide film of the third insulating portion 21p is less than the film density of the silicon oxide film of the fourth insulating portion 21h. Note that the film density is expressed by, for example, the unit of mass per unit volume (g/m$^3$).

Next, an example of a method for manufacturing the semiconductor memory device of the embodiment will be described with reference to FIG. 10A and FIG. 10B.

In the method for manufacturing the semiconductor memory device of the embodiment, the processes until the formation of the second core insulating portion 50b are the same as the processes illustrated in FIG. 4 to FIG. 7A, so their description is omitted.

Figure 10A:
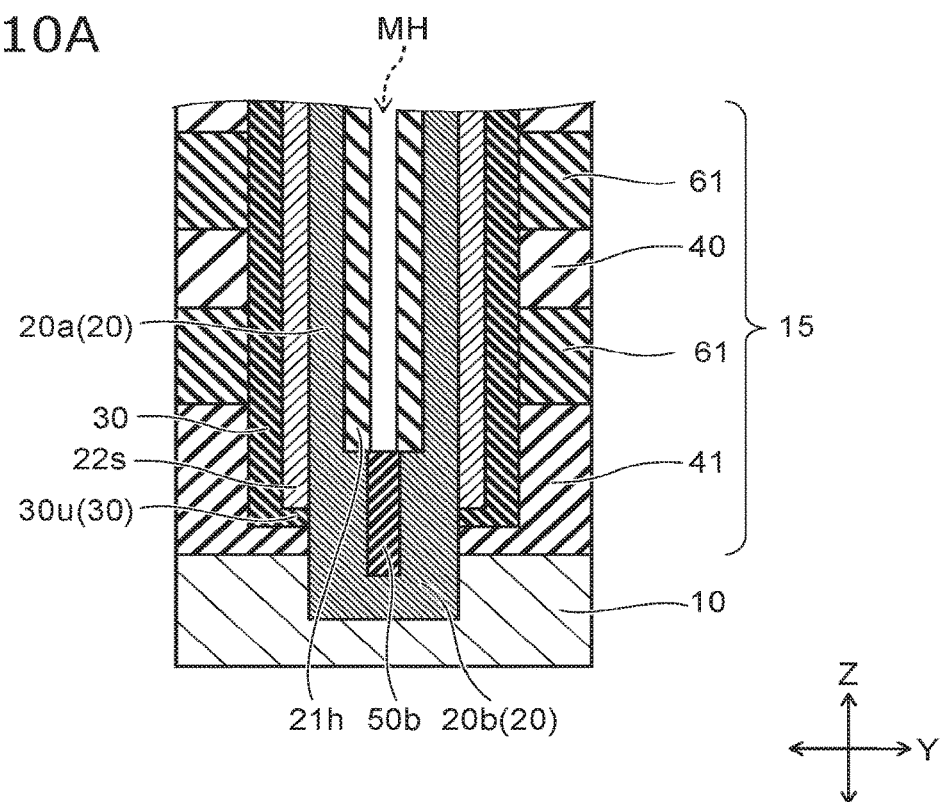
FIG. 10A and FIG. 10B are schematic cross-sectional views showing a method for manufacturing the semiconductor memory device of the second embodiment.

As illustrated in FIG. 10A, the channel body 20s and the cover film 22s are heat-treated. In this way, the channel body 20 and the cover film 22 are formed, and the fourth insulating portion 21 h is formed on the inner side of the channel body 20. For example, the thermal annealing is carried out in an oxygen atmosphere.

The fourth insulating portion 21 h is masked by the second core insulating portion 50b in the oxidation process, so it is formed on the upper side from the portion masked by the second core insulating portion 50b. In this way the channel body 20 includes the first channel body 20a and the second channel body 20b, each with a different thickness, and the fourth insulating portion 21 h is formed on the inner side of the first channel body 20a, and the second core insulating portion 50b is formed on the inner side of the second channel body 20b.

Figure 10B:
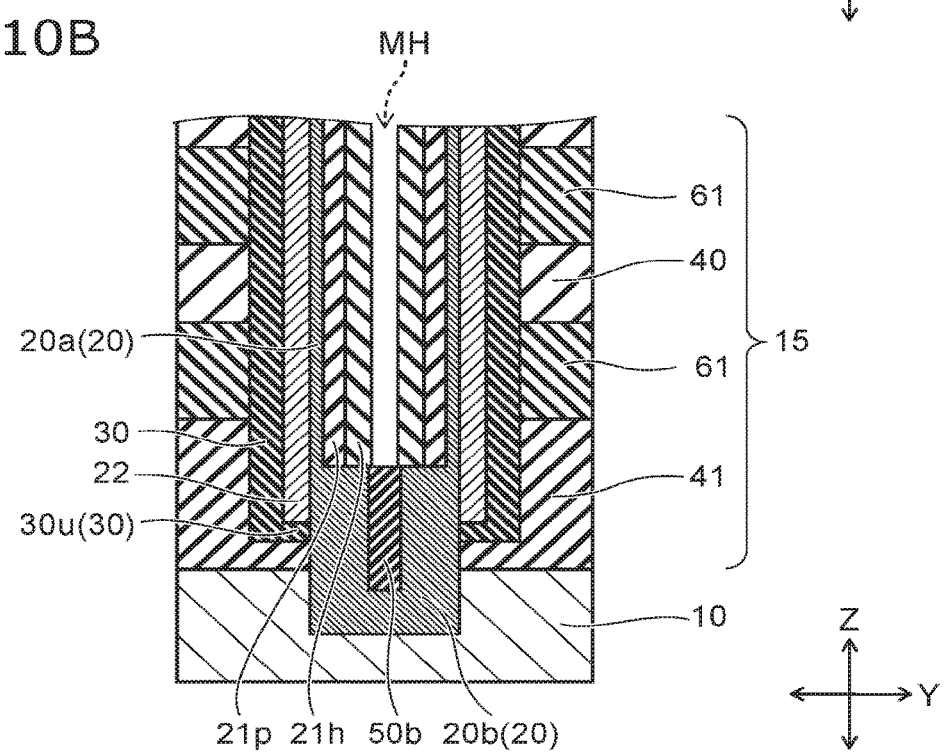

As illustrated in FIG. 10B, a plasma oxidation process (radical oxidation process) is performed on the first channel body 20a via the fourth insulating portion 21h. In this way, the third insulating portion 21p is formed between the fourth insulating portion 21h and the first channel body 20a. Therefore, the thickness of the first channel body 20a in the Y-direction is formed even thinner.

The size of the crystallites of the first channel body 20a is equal to the size of the crystallites of the second channel body 20b. In other words, by forming the crystallites and forming each of the insulating portions 21h, 21p by thermal annealing, the first channel body 20a is formed with large size crystallites, and a thin thickness.

Note that for example the thermal annealing (crystallization annealing) may be carried out to form the channel body 20 before forming the second insulating portion 50b. In this case, after forming the channel body 20, the second core insulating portion 50b is formed, and then, each of the insulating portions 21h, 21p is formed by thermal annealing and plasma oxidation processing of the channel body 20.

Then, the second core insulating portion 50b illustrated in FIG. 3B is formed on the inner side of the fourth insulating portion 21h, to form the core insulating film 50, the same as for the embodiment described above. The plurality of conductive layers, the interconnection layer LI, the upper layer interconnection and the like are formed as illustrated in FIG. 1 and FIG. 2, and the semiconductor memory device of the embodiment is formed.

The effects of the embodiment will be described.

According to the embodiment, the channel body 20 includes the first channel body 20a and the second channel body 20b, each with a different thickness, the same as for the embodiments described above. In the Y-direction, the maximum thickness of the second channel body 20b is thicker than the maximum thickness of the first channel body 20a. For example, the ratio of the size of the crystallites of the first channel body 20a to the maximum thickness D1 is not less than the ratio of the size of the crystallites of the second channel body 20b to the maximum thickness D2. Therefore, it is possible to suppress the degradation of the memory characteristics while improving the cell current.

Also, the height of the upper face 20t of the second channel body 20b is higher than the height of the lower end portion 30u of the memory film 30, and lower than the height of the source-side select gate SGS. As a result, the degradation of the memory characteristics can be further suppressed.

In addition, the insulating film 21 is provided by oxidizing a portion of the channel body 20. In this way, it is possible to simultaneously satisfy the conditions for reducing the thickness of the channel body 20 and the conditions for increasing the size of the crystallites, so degradation of the memory characteristics can be suppressed while improving the cell current.

In addition to the above, according to the embodiment, the insulating film 21 includes the third insulating portion 21p and the fourth insulating portion 21h. In this way, it is possible to further reduce the maximum thickness in the Y-direction of the first channel body 20a, and suppress the degradation of memory characteristics while improving the cell current.

For example, when forming the insulating film by oxidation of the channel body, the thickness of the insulating film depends on the thermal annealing temperature and duration. Therefore, in order to oxidize the channel body with a thick film thickness, it is necessary to carry out the thermal annealing under the conditions of high temperature and long duration. At this time, the peripheral transistor and the like are excessively heat-treated, and this can cause the problem of defects in the transistor and the like. Also, if thermal annealing is carried out under conditions of low temperature and short duration, the film thickness of the channel body will not be reduced, and generation of carriers between the electrode layers may be hindered.

In contrast, according to the embodiment, the third insulating portion 21p and the fourth insulating portion 21h are provided on the inner side of the first channel body 20a. In other words, when forming the insulating film 21, in addition to heat treating the channel body 20, the plasma oxidation process is carried out.

With the plasma oxidation process, the oxidation process of the first channel body 20a can be carried out through the fourth insulating portion 21h. In this way, the insulating film 21 can be formed thicker without thermal annealing at high temperature and long duration, and the maximum thickness in the Y-direction of the first channel body 20a can be further reduced. In other words, it is possible to simultaneously satisfy the conditions for reducing the thickness of the channel body 20 and increasing the size of the crystallites, so degradation of the memory characteristics can be suppressed while improving the cell current.

Third Embodiment

Next, an example of the configuration of the semiconductor memory device of the embodiment will be described with reference to FIG. 11A and FIG. 11B.

FIG. 11A is a schematic cross-sectional view of a semiconductor memory device according to the embodiment, and FIG. 11B is a schematic cross-sectional view at the dotted line illustrated in FIG. 11A.

In the embodiment, the main difference from the embodiments described above is the configuration of the substrate and the configuration of the stacked body. Therefore, the descriptions of the parts that are the same as the embodiments described above are partially omitted.

As illustrated in FIG. 11A and FIG. 11B, the substrate 10 includes a first portion 10e. The first portion 10e extends in the Z-direction. The source-side select gate SGS (second conductive layer) is provided at the side surface of the first portion 10e. A portion of the source-side select gate SGS is provided between the interconnection layer LI and the first portion 10e.

The first portion 10e is in contact with the second channel body 20b. The lower end portion 30u of the memory film 30 is provided above the first portion 10e. The first electrode layer WL1 (first conductive layer) is provided above the first portion 10e with the insulating layer 41 therebetween. The height of the upper face 20t of the second channel body 20b is higher than the height of the lower end portion 30u, and lower than the height of the first electrode layer WL1.

The effects of the embodiment will be described.

According to the embodiment, the channel body 20 includes the first channel body 20a and the second channel body 20b, each with a different thickness, the same as for the embodiments described above. In the Y-direction, the maximum thickness of the second channel body 20b is thicker than the maximum thickness of the first channel body 20a. For example, the ratio of the size of the crystallites of the first channel body 20a to the maximum thickness D1 is not less than the ratio of the size of the crystallites of the second channel body 20b to the maximum thickness D2. Therefore, it is possible to suppress the degradation of the memory characteristics while improving the cell current.

Also, the height of the upper face 20t of the second channel body 20b is higher than the height of the lower end portion 30u of the memory film 30, and lower than the height of the first electrode layer WL1. As a result, the degradation in the characteristics can be further suppressed.

In addition, the insulating film 21 is provided by oxidizing a portion of the channel body 20. In this way, it is possible to simultaneously satisfy the conditions for reducing the thickness of the channel body 20 and the conditions for increasing the size of the crystallites, so degradation of the memory characteristics can be suppressed while improving the cell current.

In addition to the above, according to the embodiment, the substrate 10 includes the first portion 10e extending in the Z-direction. The source-side select gate SGS is provided at the side surface of the first portion 10e. In this case also, it is possible to suppress the degradation of the memory characteristics while improving the cell current, the same as for the embodiments described above.

Fourth Embodiment

Next, an example of the configuration of the semiconductor memory device of the embodiment will be described with reference to FIG. 12A and FIG. 12B.

Figure 12A:
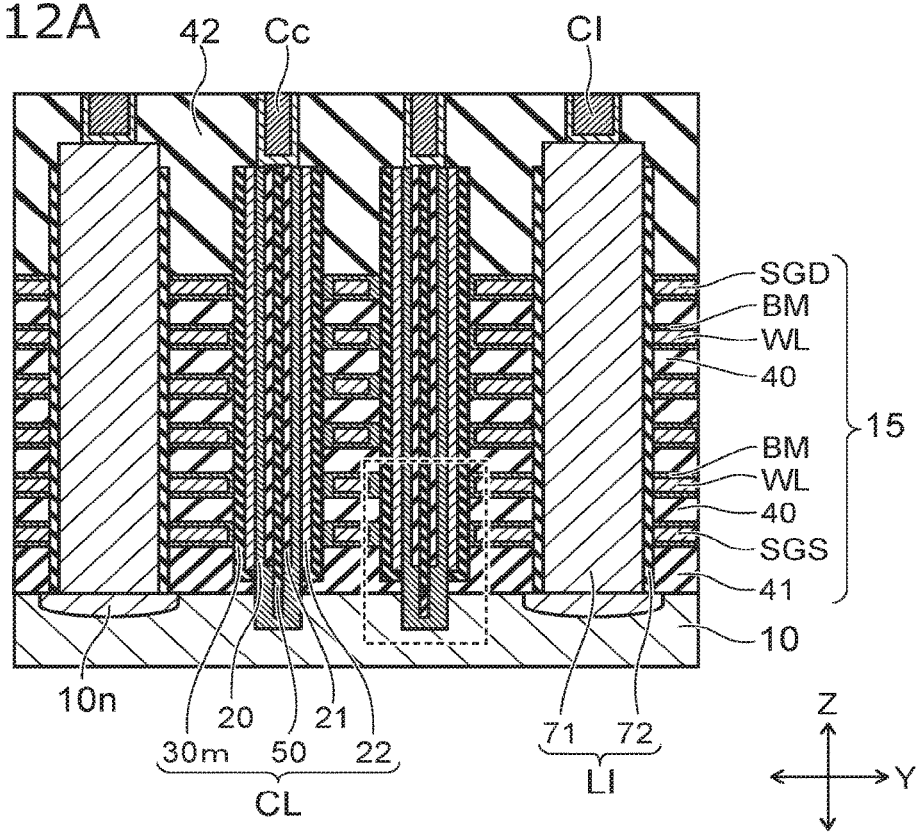
FIG. 12A and FIG. 12B are schematic cross-sectional views of the semiconductor memory device of a fourth embodiment.
Figure 12B:
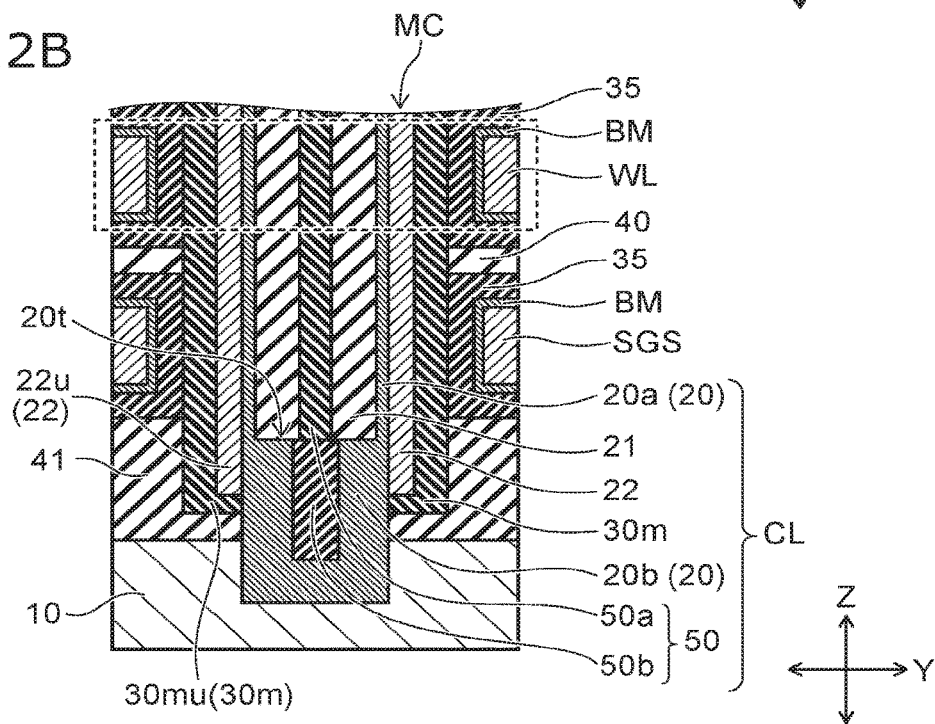

FIG. 12A is a schematic cross-sectional view of a semiconductor memory device according to the embodiment, and FIG. 12B is a schematic cross-sectional view at the dotted line illustrated in FIG. 12A.

In the embodiment, the main difference from the embodiments described above is in the configuration of the conductive layers and the memory film. Therefore, the descriptions of the parts that are the same as the embodiments described above are partially omitted.

As illustrated in FIG. 12A and FIG. 12B, a barrier film BM and the block insulating film 35 are provided on the lower face, upper face, and a portion of the side surface of the conductive layer. The barrier film BM is provided between the conductive layer and the block insulating film 35. The barrier film BM includes titanium, and for example includes a stacked film of titanium and titanium nitride.

A memory film 30 $m$ includes the tunnel insulating film 31 and the charge storage film 32. In other words, the memory film 30 $m$ has the configuration of FIG. 3A from which the block insulating film 35 has been removed.

The effects of the embodiment will be described.

According to the embodiment, the channel body 20 includes the first channel body 20a and the second channel body 20b, each with a different thickness, the same as for the embodiments described above. In the Y-direction, the maximum thickness of the second channel body 20b is thicker than the maximum thickness of the first channel body 20a. For example, the ratio of the size of the crystallites of the first channel body 20a to the maximum thickness D1 is not less than the ratio of the size of the crystallites of the second channel body 20b to the maximum thickness D2. Therefore, it is possible to suppress the degradation of the memory characteristics while improving the cell current.

Also, the height of the upper face 20t of the second channel body 20b is higher than the height of a lower end portion 30mu of a memory film 30m, and lower than the height of the source-side select gate SGS. As a result, the degradation in the characteristics can be further suppressed.

In addition, the insulating film 21 is provided by oxidizing a portion of the channel body 20. In this way, it is possible to simultaneously satisfy the conditions for reducing the thickness of the channel body 20 and the conditions for increasing the size of the crystallites, so degradation of the memory characteristics can be suppressed while improving the cell current.

In addition, according to the embodiment, the barrier film BM and the block insulating film 35 are provided on the lower face, upper face, and a portion of the side surface of the conductive layer. In this case also, it is possible to suppress the degradation of the memory characteristics while improving the cell current, the same as for the embodiments described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
a substrate;
a stacked body provided on the substrate, the stacked body including
a plurality of insulating layers including a first insulating layer, the first insulating layer provided on the substrate and being in contact with the substrate, and
a plurality of conductive layers stacked between the insulating layers and including a first conductive layer, the first conductive layer provided on the first insulating layer and being in contact with the first insulating layer;
a first semiconductor film provided in the stacked body and extending in a stacking direction of the stacked body, the first semiconductor film having a cylindrical shape;
a second semiconductor film provided integrally with the first semiconductor film, the second semiconductor film having a cylindrical shape, the second semiconductor film having a maximum thickness thicker than a maximum thickness of the first semiconductor film in a first direction crossing the stacking direction, an upper end portion of the second semiconductor film being in contact with a lower end portion of the first semiconductor film, the second semiconductor film having an upper face of the upper end portion of the second semiconductor film, a height of the upper face being lower than a height of the first conductive layer; and
a first insulating film integrally provided between the first semiconductor film and the first conductive layer, and between the second semiconductor film and the first insulating layer, the first insulating film being disposed on an outer peripheral surface of the first semiconductor film and on an outer peripheral surface of the second semiconductor film, the first insulating film extending in the stacking direction, the first insulating film being in contact with the second semiconductor film, the first insulating film having a lower end portion, a height of the lower end portion of the first insulating film being lower than the height of the upper face of the second semiconductor film.

2. The device according to claim 1, further comprising a second insulating film provided on an inner side of the first semiconductor film, extending in the stacking direction, and being in contact with the upper face of the second semiconductor film.

3. The device according to claim 2, further comprising a third insulating film provided on an inner side of the second semiconductor film and an inner side of the second insulating film, the third insulating film extending in the stacking direction.

4. The device according to claim 3, wherein the second insulating film includes an oxide, and has an interface at a portion in contact with the third insulating film.

5. The device according to claim 4, wherein the third insulating film includes
- a first insulating portion provided in a position higher than a height of the upper face of the second semiconductor film, the first insulating portion being in contact with a side surface of the inner side of the second insulating film; and
- a second insulating portion provided below the first insulating portion, the second insulating portion being in contact with a side surface of the inner side of the second semiconductor film.

6. The device according to claim 3, wherein the third insulating film is separated from the first semiconductor film.

7. The device according to claim 2, wherein the second insulating film includes
- a third insulating portion provided on an inner side of the first semiconductor film; and
- a fourth insulating portion provided on an inner side of the insulating portion, wherein
- the upper face of the second semiconductor film is in contact with the third insulating portion and the fourth insulating portion.

8. The device according to claim 1, wherein a ratio of a size of crystallites of the first semiconductor film to the maximum thickness of the first semiconductor film is not less than a ratio of a size of crystallites of the second semiconductor film to the maximum thickness of the second semiconductor film.

9. The device according to claim 1, further comprising a third semiconductor film provided between the first insulating film and the first semiconductor film, and between the first insulating film and the second semiconductor film, the third semiconductor film being in contact with the first semiconductor film and the second semiconductor film, the third semiconductor film extending in the stacking direction.

10. The device according to claim 9, wherein a lower end portion of the first insulating film is provided between the third semiconductor film and the substrate.

11. The device according to claim 1, wherein
the substrate includes a first portion extending in the stacking direction, and
the plurality of conductive layers includes a second conductive layer separated from the substrate, the second conductive layer is provided below the first conductive layer and on a side surface of the first portion.

12. A semiconductor memory device, comprising:
a stacked body provided on the substrate, the stacked body including
- a plurality of insulating layers including a first insulating layer, the first insulating layer provided on the substrate and being in contact with the substrate, and
- a plurality of conductive layers stacked between the insulating layers and including a first conductive layer, the first conductive layer provided on the first insulating layer and being in contact with the first insulating layer;

a first semiconductor film provided in the stacked body and extending in a stacking direction of the stacked body, the first semiconductor film surrounded by the first conductive layer and the first insulating layer;

a second semiconductor film having a maximum thickness thicker than the maximum thickness of the first semiconductor film in a first direction crossing the stacking direction, the second semiconductor film provided between the first semiconductor film and the substrate, the second semiconductor film integrally provided with the first semiconductor film and being in contact with the substrate; and a third semiconductor film integrally provided between the first conductive layer and the first semiconductor film, and between the first insulating layer and the second semiconductor film, the third semiconductor film being in contact with the first semiconductor film and the second semiconductor film, wherein a ratio of a size of crystallites of the first semiconductor film to the maximum thickness of the first semiconductor film is not less than a ratio of a size of crystallites of the second semiconductor film to the maximum thickness of the second semiconductor film.

* * * * *